(12) United States Patent
Ishida et al.

(10) Patent No.: US 12,385,988 B2
(45) Date of Patent: Aug. 12, 2025

(54) MAGNETIC DETECTION APPARATUS AND CURRENT DETECTION APPARATUS

(71) Applicants: Yokogawa Electric Corporation, Musashino (JP); Yokogawa Test & Measurement Corporation, Hachioji (JP)

(72) Inventors: Hiroyuki Ishida, Hachioji (JP); Hiroki Minami, Hachioji (JP)

(73) Assignees: YOKOGAWA ELECTRIC CORPORATION, Tokyo (JP); YOKOGAWA TEST & MEASUREMENT CORPORATION, Tokyo (JP)

( * ) Notice: Subject to any disclaimer, the term of this patent is extended or adjusted under 35 U.S.C. 154(b) by 0 days.

(21) Appl. No.: 18/207,351

(22) Filed: Jun. 8, 2023

(65) Prior Publication Data
US 2024/0012072 A1    Jan. 11, 2024

(30) Foreign Application Priority Data
Jul. 6, 2022   (JP) .................................. 2022-109282

(51) Int. Cl.
*G01R 33/04* (2006.01)
*A23L 19/10* (2016.01)
(Continued)

(52) U.S. Cl.
CPC .......... *G01R 33/04* (2013.01); *G01R 15/185* (2013.01); *G01R 33/0041* (2013.01); *A23L 19/105* (2016.08); *A23L 33/30* (2016.08)

(58) Field of Classification Search
CPC .. G01R 33/04; G01R 15/185; G01R 33/0041; G01R 33/06; G01R 19/0092;
(Continued)

(56) References Cited

U.S. PATENT DOCUMENTS

| 6,268,725 B1 | 7/2001 | Vernon et al. |
| 2010/0308816 A1 | 12/2010 | Ueda et al. |

(Continued)

FOREIGN PATENT DOCUMENTS

| JP | 2004-257904 A | 9/2004 |
| JP | 2013-205180 A | 10/2013 |

(Continued)

OTHER PUBLICATIONS

KR 20050044155 Machine Translation, May 12, 2005 (Year: 2005).*
(Continued)

*Primary Examiner* — Raul J Rios Russo
(74) *Attorney, Agent, or Firm* — WHDA, LLP

(57) ABSTRACT

A magnetic detection apparatus includes a core to which magnetism to be detected is applied, an exciter configured to excite the core with an excitation signal, a detector configured to detect induced voltage according to a time change of magnetic flux generated by the core, a wave detector configured to detect a wave from a signal corresponding to the induced voltage by using a detection signal corresponding to the excitation signal and to generate a signal according to the magnetism to be detected, and a signal converter configured to generate and output to the exciter an excitation signal that has a spread spectrum of a signal having an excitation frequency and to generate and output to the wave detector a detection signal that has a spread spectrum of a signal having a detection frequency of twice the excitation frequency.

6 Claims, 9 Drawing Sheets

(51) Int. Cl.
*A23L 33/00* (2016.01)
*G01R 15/18* (2006.01)
*G01R 33/00* (2006.01)

(58) Field of Classification Search
CPC . G01R 33/0029; A23L 19/105; A23L 3/0155; A23L 33/30
USPC .......................................................... 324/253
See application file for complete search history.

(56) References Cited

U.S. PATENT DOCUMENTS

| | | | | |
|---|---|---|---|---|
| 2015/0077101 A1* | 3/2015 | Oikawa | ............... | G01R 33/0041 324/258 |
| 2015/0085419 A1* | 3/2015 | Oikawa | ................ | H03K 17/82 361/159 |
| 2015/0160271 A1* | 6/2015 | Yoshida | ................ | G01R 33/06 324/117 R |
| 2015/0204916 A1* | 7/2015 | Akimoto | ............... | G01R 15/207 702/64 |
| 2018/0372509 A1* | 12/2018 | Yoshiya | ................ | G01D 5/145 |
| 2020/0150155 A1* | 5/2020 | Sakai | ................... | G01R 15/207 |

FOREIGN PATENT DOCUMENTS

| | | |
|---|---|---|
| JP | 2019-138796 A | 8/2019 |
| KR | 10-2005-0044155 A | 5/2005 |
| WO | 2009/057626 A1 | 5/2009 |

OTHER PUBLICATIONS

Extended European Search Report dated Jan. 12, 2023, issued in counterpart EP application No. 23177711.1. (8 pages).
Office Action dated Feb. 4, 2025, issued in counterpart JP Application No. 2022-109282, with English translation. (8 pages).
Office Action dated Jun. 10, 2025, issued in counterpart JP Application No. 2022-109282, with English translation. (4 pages).

* cited by examiner

MAGNETIC DETECTION APPARATUS AND CURRENT DETECTION APPARATUS

CROSS REFERENCE TO RELATED APPLICATION

This application claims priority to and the benefit of Japanese Patent Application No. 2022-109282 (filed on Jul. 6, 2022), the entire contents of which are incorporated herein by reference.

TECHNICAL FIELD

The present disclosure relates to a magnetic detection apparatus and a current detection apparatus.

BACKGROUND

Conventionally, a zero-flux type current sensor that includes a fluxgate sensor is known as a magnetic sensor that detects the magnetic flux in a magnetic core. For example, see Patent Literature (PTL) 1.

CITATION LIST

Patent Literature

PTL 1: JP 2019-138796 A

SUMMARY

A magnetic detection apparatus according to several embodiments includes a core to which magnetism to be detected is applied, an exciter configured to excite the core with an excitation signal, a detector configured to detect induced voltage according to a time change of magnetic flux generated by the core, a wave detector, and a signal converter. The wave detector is configured to detect a wave from a signal corresponding to the induced voltage by using a detection signal corresponding to the excitation signal and to generate a signal according to the magnetism to be detected. The signal converter is configured to generate and output to the exciter an excitation signal that has a spread spectrum of a signal having an excitation frequency and to generate and output to the wave detector a detection signal that has a spread spectrum of a signal having a detection frequency of twice the excitation frequency.

A current detection apparatus according to several embodiments includes the aforementioned magnetic detection apparatus, a current detection core in which the core of the magnetic detection apparatus is installed, a feedback coil wound around the current detection core, and an amplifier. The amplifier is configured to apply a current to the feedback coil according to a signal outputted from the low pass filter of the magnetic detection apparatus. The current detection core is positioned to surround a wire through which a current to be detected flows.

DETAILED DESCRIPTION

Figure 1:
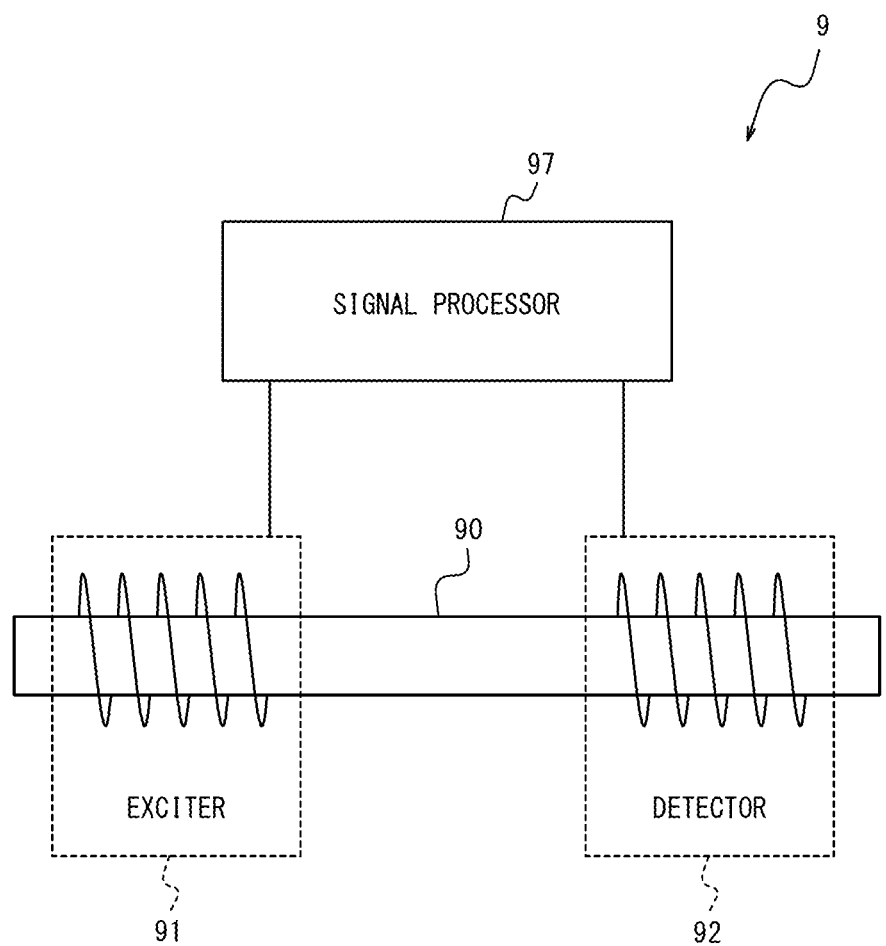
FIG. 1 is a schematic diagram illustrating a configuration of a magnetic detection apparatus according to a comparative example.

The fluxgate sensor detects the time change of magnetic flux and outputs a detection signal. If the time change of the magnetic flux includes a component with a frequency close to a multiple of the frequency of the fluxgate sensor's excitation signal, the detection signal contains noise corresponding to a beat signal. The noise reduces the detection accuracy. It would be helpful to provide a magnetic detection apparatus and a current detection apparatus that can improve detection accuracy.

A magnetic detection apparatus according to several embodiments includes a core to which magnetism to be detected is applied, an exciter configured to excite the core with an excitation signal, a detector configured to detect induced voltage according to a time change of magnetic flux generated by the core, a wave detector, and a signal converter. The wave detector is configured to detect a wave from a signal corresponding to the induced voltage by using a detection signal corresponding to the excitation signal and to generate a signal according to the magnetism to be detected. The signal converter is configured to generate and output to the exciter an excitation signal that has a spread spectrum of a signal having an excitation frequency and to generate and output to the wave detector a detection signal that has a spread spectrum of a signal having a detection frequency of twice the excitation frequency. In this way, a beat signal included in the detected signal can be reduced. The detection accuracy of the magnetism to be detected can thereby be enhanced.

In the magnetic detection apparatus according to an embodiment, the signal converter may be configured to generate the excitation signal and the detection signal so that the frequency spectrum of the detection signal and the frequency spectrum of the excitation signal have a similar relationship. In this way, the signal that is included in the signal synchronously detected by the wave detector and that corresponds to the magnetic flux generated in the core is less likely to be deformed. The magnetic flux generated in the core and the magnetism to be detected that generates that magnetic flux can thereby be detected with high accuracy.

In a magnetic detection apparatus according to an embodiment, the signal converter may be configured to generate the excitation signal and the detection signal so that a width of a frequency band of the detection signal is twice a width of a frequency band of the excitation signal. In this way, the signal that is included in the signal synchronously detected by the wave detector and that corresponds to the magnetic flux generated in the core is less likely to be deformed. The magnetic flux generated in the core and the magnetism to be detected that generates that magnetic flux can thereby be detected with high accuracy.

A magnetic detection apparatus according to an embodiment may further include a low pass filter configured to attenuate a frequency component, equal to or greater than a cutoff frequency, of the signal according to the magnetism to be detected generated by the wave detector. In a magnetic detection apparatus according to an embodiment, the signal converter may be configured to generate the excitation signal so that a value of a width of a frequency band of the excitation signal is greater than twice a value of the cutoff frequency. In this way, at least some components of the beat signal included in the detected signal can be attenuated by the low pass filter. The detection accuracy of the magnetism to be detected can thereby be enhanced.

A current detection apparatus according to several embodiments includes the aforementioned magnetic detection apparatus, a current detection core in which the core of the magnetic detection apparatus is installed, a feedback coil wound around the current detection core, and an amplifier. The amplifier is configured to apply a current to the feedback coil according to a signal outputted from the low pass filter of the magnetic detection apparatus. The current detection core is positioned to surround a wire through which a current to be detected flows. In this way, a beat signal included in the detected signal can be reduced. The detection accuracy of the current to be detected can thereby be enhanced.

According to the magnetic detection apparatus and the current detection apparatus of the present disclosure, detection accuracy can be enhanced.

Embodiments of the present disclosure are described while being compared to a comparative example.

Comparative Example

Figure 2:
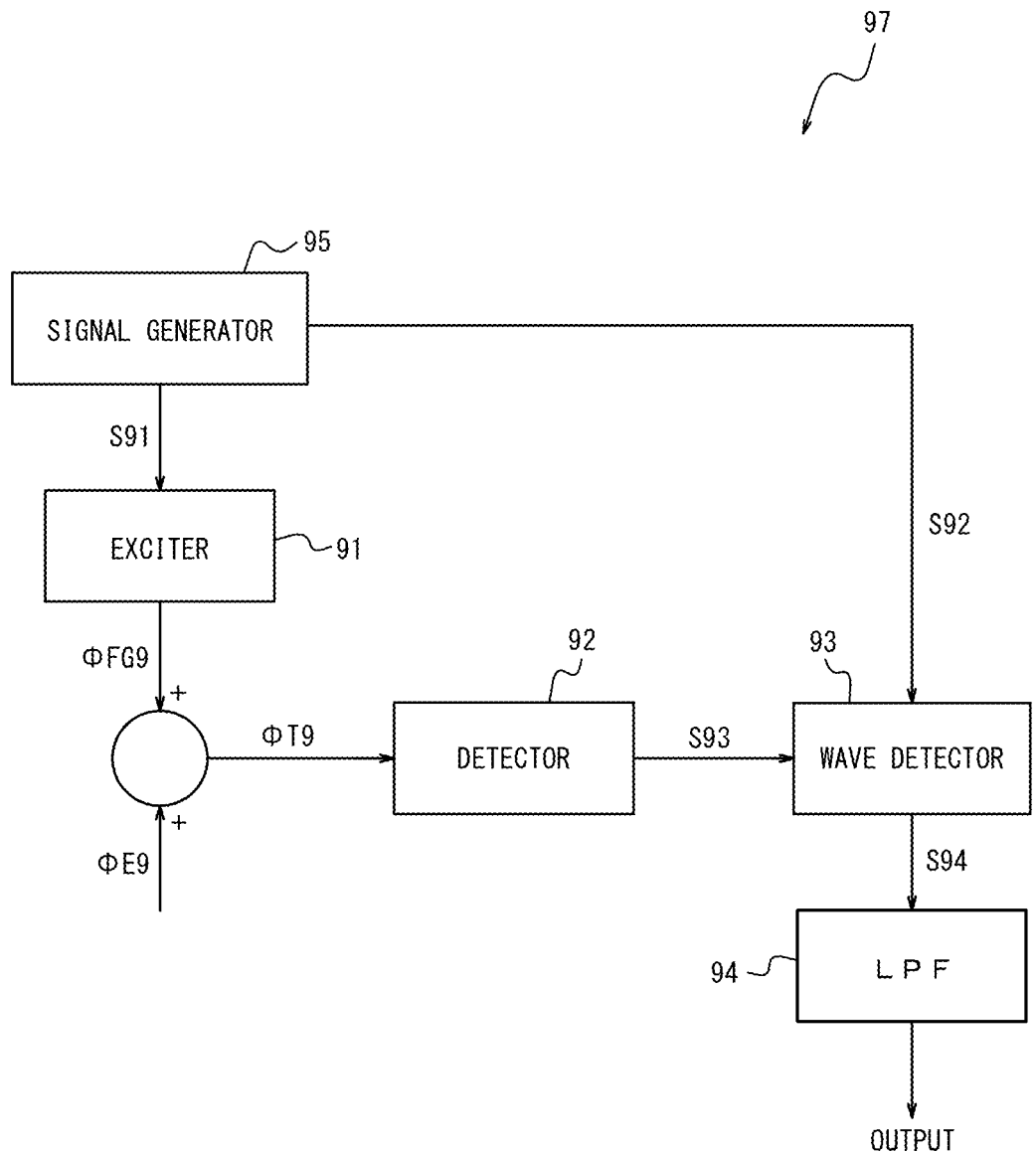
FIG. 2 is a block diagram of a signal processor according to the comparative example.

As illustrated in FIG. 1, a magnetic detection apparatus 9 according to a comparative example includes a core 90, an exciter 91, a detector 92, and a signal processor 97. As illustrated in FIG. 2, the signal processor 97 includes a signal generator 95, a wave detector 93, and a low pass filter (LPF) 94.

The core 90 is configured to include a magnetic material. The exciter 91 is configured to include a coil and excites the core 90 with a magnetic field generated by passing a current through the coil. The magnetic flux generated in the core 90 by the excitation is represented as $\varphi FG9$. $\varphi FG9$ is an alternating current magnetic flux having an excitation frequency represented by f91.

The signal of the current flowing for excitation in the exciter 91 is generated by the signal generator 95. The signal generator 95 generates an alternating current excitation signal (S91) having the excitation frequency and outputs the signal (S91) to the exciter 91.

When an external magnetic field is applied to the magnetic detection apparatus 9, a magnetic flux is also generated in the core 90 by that magnetic field, regardless of excitation. The magnetic flux generated in the core 90 by the externally applied magnetic field is represented as $\varphi E9$. $\varphi F9$ is an alternating current magnetic flux having a frequency represented by fE9.

The magnetic flux generated in the core 90 is the magnetic flux that is the combination of $\varphi FG9$ and $\varphi E9$ and is represented as $\varphi T9$. In the representation in FIG. 2, $\varphi T9$ is outputted as the magnetic flux that is the sum of $\varphi FG9$ and $\varphi E9$. $\varphi T9$ is inputted to the detector 92.

The detector 92 is configured to include a coil and detects and outputs the voltage induced in the coil according to the time change of the magnetic flux ($\varphi T9$) generated in the core 90. In other words, the detector 92 detects and outputs a signal (S93) of the induced voltage of the coil as a signal corresponding to the time change of the magnetic flux ($\varphi T9$) generated in the core 90.

From the signal (S93) of the induced voltage detected by the detector 92, the wave detector 93 generates a synchronously detected signal (S94) based on a detection signal and outputs the signal (S94) to the LPF 94. The detection signal is generated by the signal generator 95.

The LPF 94 outputs the signal (S94) synchronously detected by the wave detector 93 while attenuating components with a frequency equal to or greater than a predetermined frequency. The predetermined frequency is also referred to as the cutoff frequency and is represented by fC9.

Figure 3:
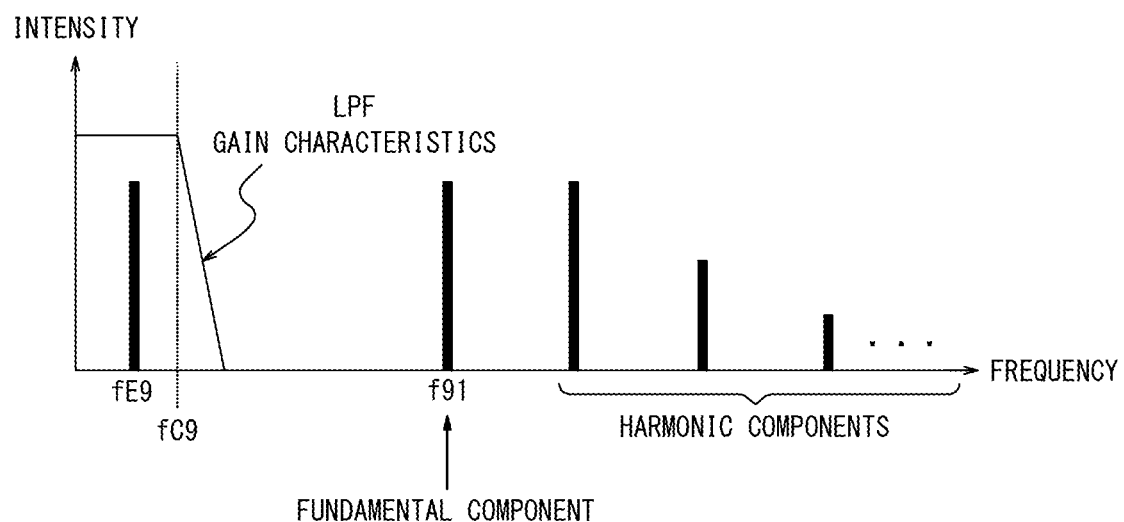
FIG. 3 is a diagram illustrating the frequency spectrum of the detection result in a case in which the frequency of the magnetism to be detected is low in the magnetic detection apparatus according to the comparative example.
Figure 4:
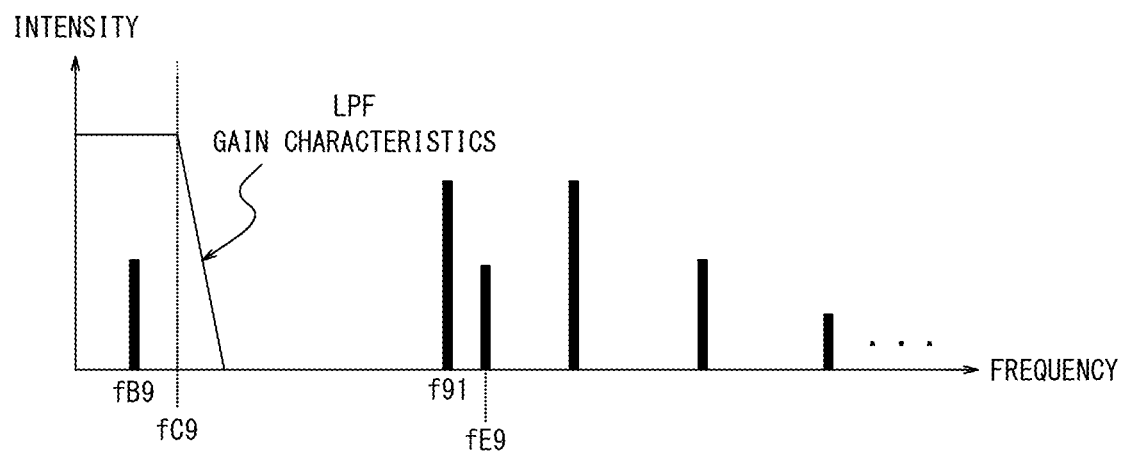
FIG. 4 is a diagram illustrating the frequency spectrum of the detection result in a case in which the frequency of the magnetism to be detected is close to the excitation frequency in the magnetic detection apparatus according to the comparative example.

The signal (S94) detected by the wave detector 93 is represented as a frequency spectrum divided into frequency components as illustrated in FIGS. 3 and 4. In FIGS. 3 and 4, the horizontal axis represents the frequency, and the vertical axis represents the intensity of each frequency component. The component with a frequency of f91 corresponds to the current signal (S91) flowing in the exciter 91. The component with a frequency of f91 is also referred to as the fundamental component. Components with a frequency higher than f91 are also referred to as harmonic components.

FIG. 3 represents the frequency spectrum of the signal (S94) in a case in which the frequency (fE9) of the magnetic flux ($\varphi E9$) generated in the core 90 in response to the magnetic field externally applied to the core 90 is significantly lower than the excitation frequency (f91) and lower than the cutoff frequency (fC9) of the LPF 94. Among the frequency components of the signal (S94) represented by the frequency spectrum in FIG. 3, the components with frequencies higher than fC9 are attenuated by the LPF 94. The signal outputted from the LPF 94 is only the component with frequency fE9, which is the signal corresponding to the magnetic flux ($\varphi E9$). Consequently, the signal processor 97 can detect the magnetic flux ($\varphi E9$).

Figure 5:
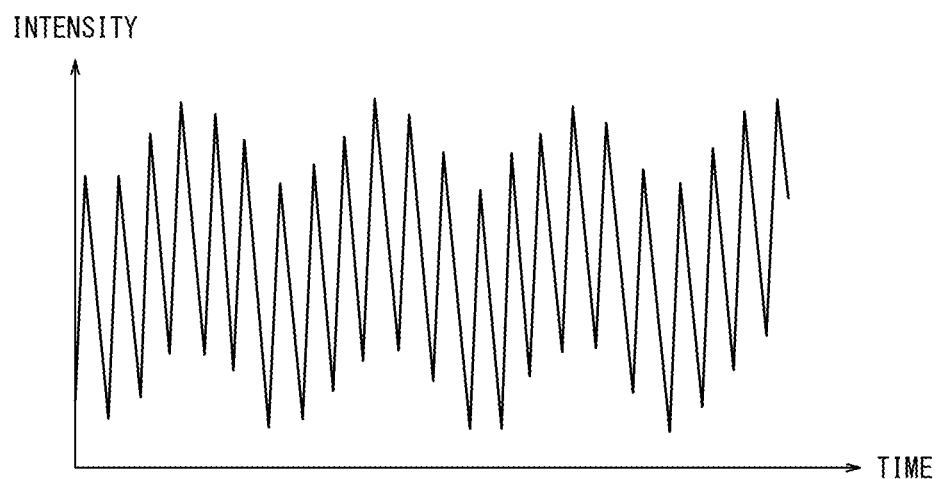
FIG. 5 is a diagram illustrating the waveform of the signal detected in a case in which the frequency of the magnetism to be detected is close to the excitation frequency in the magnetic detection apparatus according to the comparative example.

Conversely, FIG. 4 represents the frequency spectrum of the signal (S94) in a case in which the frequency (fE9) of the magnetic flux ($\varphi E9$) generated in the core 90 in response to the magnetic field externally applied to the core 90 is close to the excitation frequency (f91) or to a multiple of f91 and is higher than the cutoff frequency (fC9) of the LPF 94. The signal corresponding to the frequency spectrum in FIG. 4 has the waveform illustrated in FIG. 5. In FIG. 5, the vertical axis represents signal intensity, and the horizontal axis represents time. The waveform in FIG. 5 includes a component of a beat signal that has a frequency that is the difference between the frequency f91 of the excitation signal and the frequency fE9 of the magnetic flux φE9. The frequency of the beat signal is represented by fB9. The frequency spectrum in FIG. 4 includes the frequency component of the beat signal.

Figure 6:
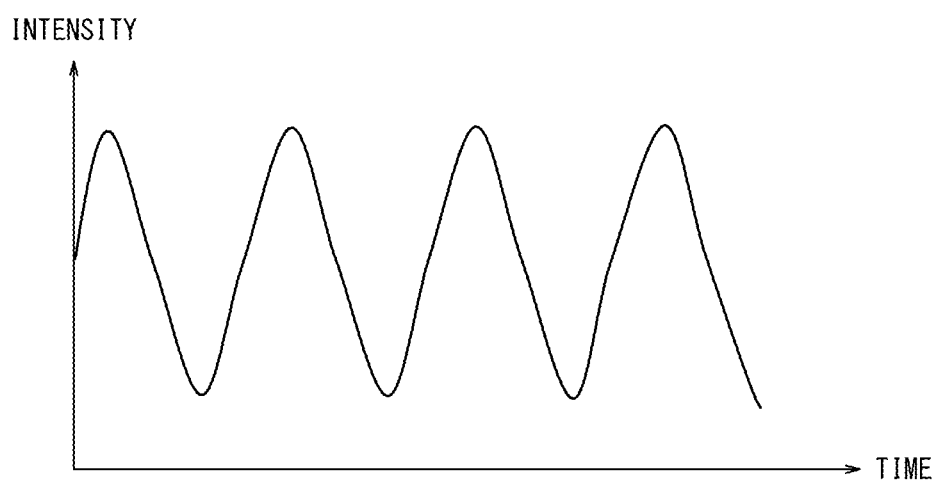
FIG. 6 is a diagram illustrating the waveform of the signal illustrated in FIG. 5 processed by a LPF.

Among the frequency components of the signal (S94) represented by the frequency spectrum in FIG. 4, the components with frequencies higher than fC9 are attenuated by the LPF 94. In a case in which fB9 is lower than fC9, the signal outputted from the LPF 94 becomes only the component with the frequency fB9. In other words, the signal outputted from the LPF 94 includes a signal corresponding to the beat signal instead of a signal corresponding to the magnetic flux (φE9) and has the waveform illustrated in FIG. 6. In FIG. 6, the vertical axis represents signal intensity, and the horizontal axis represents time. As a result of the inclusion of the signal corresponding to the beat signal in the signal outputted from the LPF 94, the signal processor 97 erroneously detects the beat signal as the magnetic flux (φE9). In other words, the signal processor 97 erroneously detects the magnetic flux (φE9) as including a low-frequency component in a case in which the magnetic flux (φE9) does not include a low-frequency component below the cutoff frequency of the LPF 94.

As described above, in the magnetic detection apparatus 9 according to the comparative example, a component of a beat signal is included as noise in the detected signal in a case in which the frequency of the magnetic field to be detected is close to the excitation frequency or to a multiple of the excitation frequency. A magnetic detection apparatus 1 (see FIGS. 7 and 8) that can reduce noise is described below.

Figure 7:
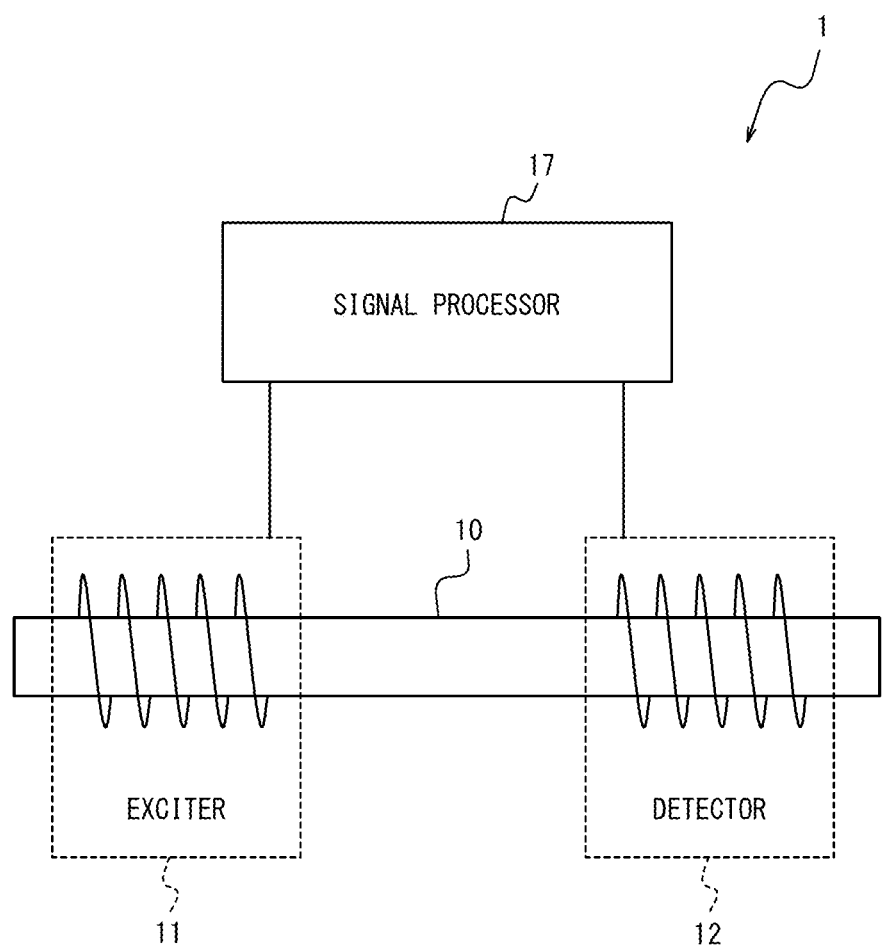
FIG. 7 is a schematic diagram of an example configuration of a magnetic detection apparatus according to an embodiment.
Figure 8:
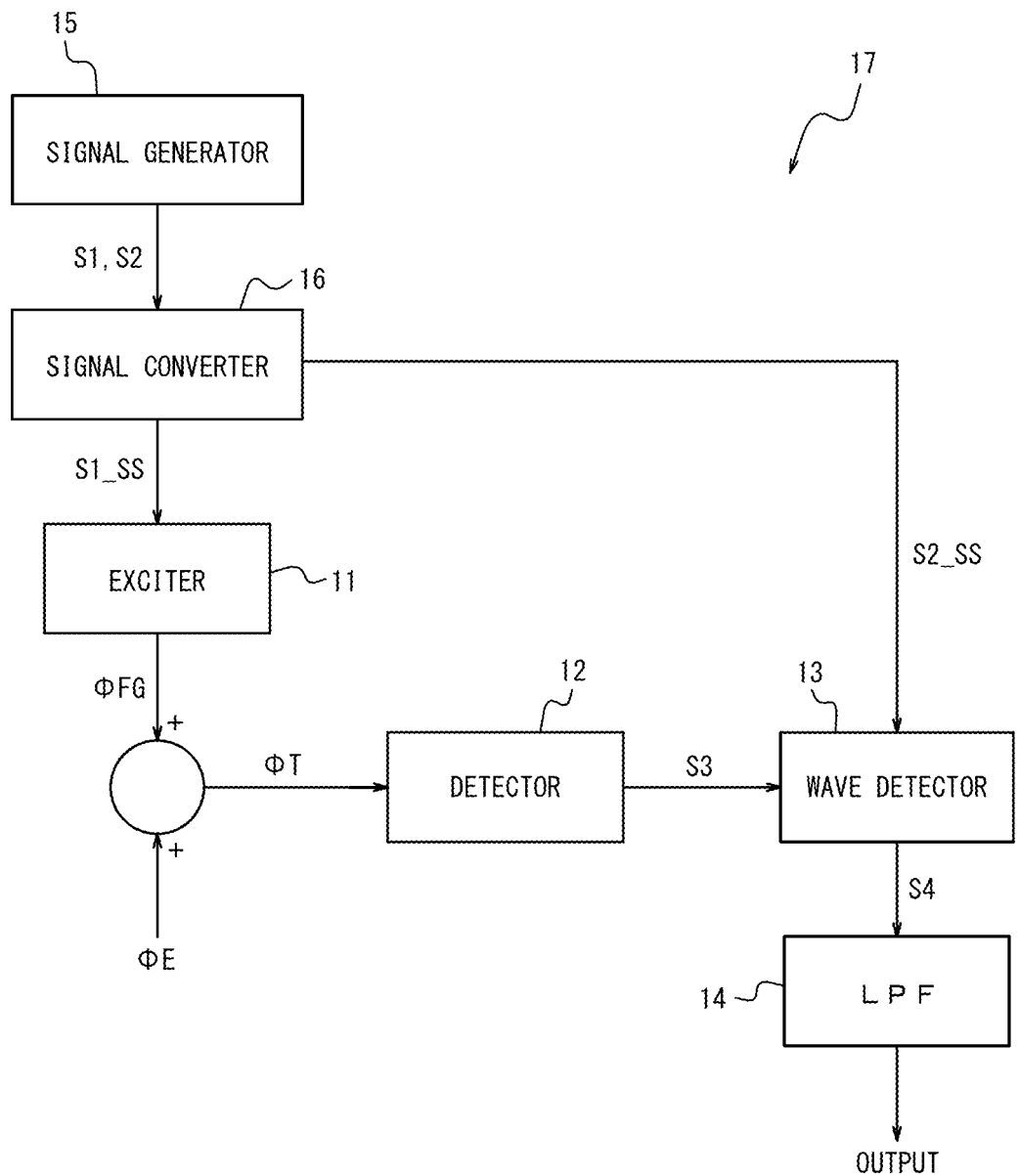
FIG. 8 is a block diagram of a signal processor according to the embodiment.

Example Configuration of Magnetic Detection Apparatus 1 According to Embodiment of Present Disclosure As illustrated in FIG. 7, a magnetic detection apparatus 1 according to an embodiment includes a core 10, an exciter 11, a detector 12, and a signal processor 17. The signal processor 17 includes a signal generator 15, a signal converter 16, a wave detector 13, and an LPF 14, as illustrated in FIG. 8. The magnetic detection apparatus 1 detects, as magnetism, a magnetic field applied externally to the magnetic detection apparatus 1. The magnetism or magnetic field detected by the magnetic detection apparatus 1 is also referred to as the magnetism to be detected.

The core 10 is configured to include a magnetic material. The exciter 11 is configured to include a coil and excites the core 10 with a magnetic field generated by passing a current through the coil. The magnetic flux generated in the core 10 by the excitation is represented as φFG. φFG is assumed to be an alternating current magnetic flux having an excitation frequency represented by f1.

The signal of the current flowing for excitation in the exciter 11 is generated by the signal generator 15 and the signal converter 16. The signal generator 15 generates an alternating current signal (S1) having the excitation frequency and outputs the signal (S1) to the signal converter 16. The signal generator 15 may be configured to include an oscillation circuit. The signal converter 16 generates a spread signal (S1_SS) that has a spread spectrum of the signal (S1) and outputs the spread signal (S1_SS) as an excitation signal to the exciter 11, and a current corresponding to the excitation signal is applied to the exciter 11. The signal converter 16 may be configured to spread the spectrum of the signal by any of various methods, such as direct spreading, frequency hopping, or a hybrid method.

When an external magnetic field is applied to the magnetic detection apparatus 1, a magnetic flux is also generated in the core 10 by that magnetic field, regardless of excitation. The magnetic flux generated in the core 10 by the externally applied magnetic field is represented as PE. PE is assumed to be an alternating current magnetic flux having a frequency represented by fE.

The magnetic flux generated in the core 10 is assumed to be the magnetic flux that is the combination of φFG and φE and is represented as φT. In the representation in FIG. 8, φT is outputted as the magnetic flux that is the sum of φFG and φE. φT is inputted to the detector 12.

The detector 12 is configured to include a coil and detects and outputs the voltage induced in the coil according to the time change of the magnetic flux (φT) generated in the core 10. In other words, the detector 12 detects and outputs a signal (S3) of the induced voltage of the coil as a signal corresponding to the time change of the magnetic flux (φT) generated in the core 10.

From the signal (S3) of the induced voltage detected by the detector 12, the wave detector 13 generates a synchronously detected signal (S4) based on the detection signal and outputs the signal (S4) to the LPF 14.

The wave detector 13 may be configured to include a switch that switches the signal to be outputted according to the intensity of the detection signal. The switch may be configured to output the signal (S3) of the induced voltage as is to the LPF 14 when the intensity of the detection signal (S2_SS) is positive and to invert the signal (S3) of the induced voltage and output the result to the LPF 14 when the intensity of the detection signal is negative.

The detection signal is generated by the signal generator 15 and the signal converter 16. The signal generator 15 generates an alternating current signal (S2) having a detection frequency of twice the excitation frequency and outputs the signal (S2) to the signal converter 16. The signal converter 16 generates a spread signal (S2_SS) that has a spread spectrum of the signal (S2) and outputs the spread signal (S2_SS) as a detection signal to the wave detector 13.

The signal converter 16 generates the excitation signal and detection signal so that the width of the frequency band of the spread signal (S2_SS) generated as the detection signal is twice the width of the frequency band of the spread signal (S1_SS) generated as the excitation signal. The signal converter 16 may generate the spread signal (S1_SS) so that the frequency at the center of the frequency band of the signal (S1_SS), which has a spread spectrum of the signal (S1), is the frequency of the signal (S1) before spreading, and so that the upper and lower limits of the frequency band of the signal (S1_SS), which has a spread spectrum of the signal (S1), are values yielded by increasing or decreasing, by a predetermined percentage, the value of the frequency of the signal (S1) before spreading. The signal converter 16 may generate the spread signal (S2_SS) so that the frequency at the center of the frequency band of the signal (S2_SS), which has a spread spectrum of the signal (S2), is the frequency of the signal (S2) before spreading, and so that the upper and lower limits of the frequency band of the signal (S2_SS), which has a spread spectrum of the signal (S2), are values yielded by increasing or decreasing, by a predetermined percentage, the value of the frequency of the signal (S2) before spreading. When spreading the spectrum of the signals (S1 and S2), the signal converter 16 sets the same value as the predetermined percentage that defines the upper and lower limits of the frequency band of the spread signals (S1_SS and S2_SS). The signal converter 16 may set ±10%, for example, as the predetermined percentage.

The signal converter 16 generates the excitation signal and detection signal so as not only to match the relationship between the frequency of the spread signal (S1_SS) and the frequency of the spread signal (S2_SS), but also to match the phase of the spread signal (S1_SS) and the phase of the spread signal (S2_SS). When the phase of the spread signal (S1_SS) and the phase of the spread signal (S2_SS) match, a low-frequency signal can be detected by wave detection.

The signal converter 16 may spread both the signal (S1) and the signal (S2) using the same spreading code to generate the spread signal (S1_SS) and the spread signal (S2_SS). In this way, the frequencies of the spread signal (S1_SS) and the spread signal (S2_SS) will have the above-described relationship. Furthermore, the phase of the spread signal (S1_SS) and the phase of the spread signal (S2_SS) match.

The signal converter 16 may be configured to acquire only the signal (S2) that has the detection frequency of twice the excitation frequency from the signal generator 15 and generate the spread signal (S2_SS) that has a spread spectrum of the signal (S2). The signal converter 16 may be configured to use a circuit that divides the frequency of the spread signal (S2_SS) in half to generate the spread signal (S1_SS) that has a spread spectrum of the signal (S1) that has the excitation frequency. In other words, the signal converter 16 may spread the spectrum of only the signal (S2), without spreading the spectrum of the signal (S1). With this configuration, the upper and lower limits on the frequency band of the spread signals (S1_SS and S2_SS) are values calculated as the same percentage relative to the center frequency. Furthermore, by the spread signal (S2_SS) being divided to generate the spread signal (S1_SS), the phase of the spread signal (S1_SS) and the phase of the spread signal (S2_SS) match.

The signal generator 15 may be configured to generate both the signal (S1) and the signal (S2). The signal generator 15 may be configured to generate the signal (S2) that has the detection frequency of twice the excitation frequency and to generate the signal (S1) that has the excitation frequency using a circuit that divides the frequency of the signal (S2) in half.

The LPF 14 outputs the signal (S4) synchronously detected by the wave detector 13 while attenuating components with a frequency equal to or greater than a predetermined frequency. The predetermined frequency is also referred to as the cutoff frequency and is represented by fC. The LPF 14 may, for example, be configured to include an RC circuit.

Figure 9:
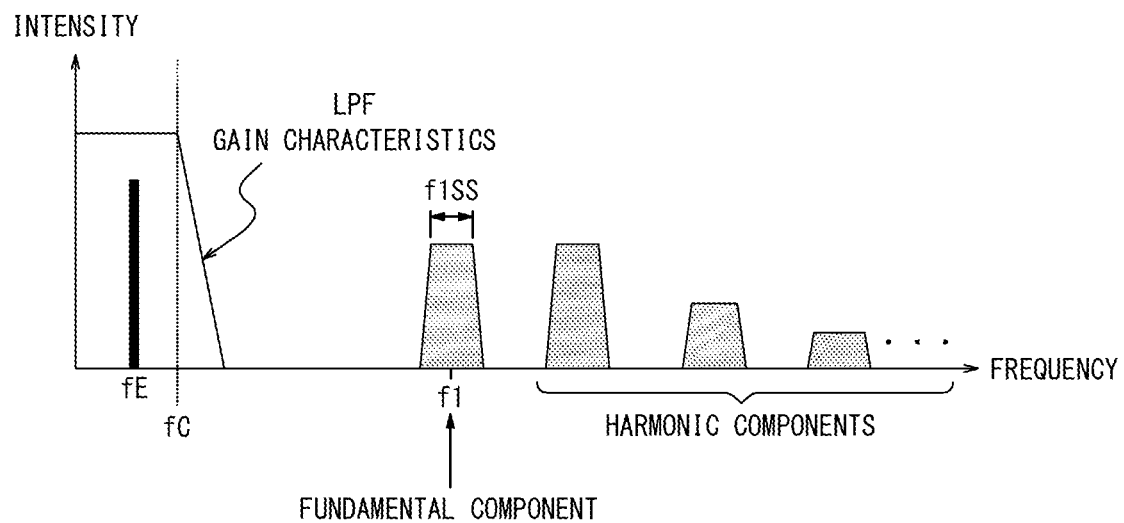
FIG. 9 is a diagram illustrating the frequency spectrum of the detection result in a case in which the frequency of the magnetism to be detected is low in the magnetic detection apparatus according to the embodiment.
Figure 10:
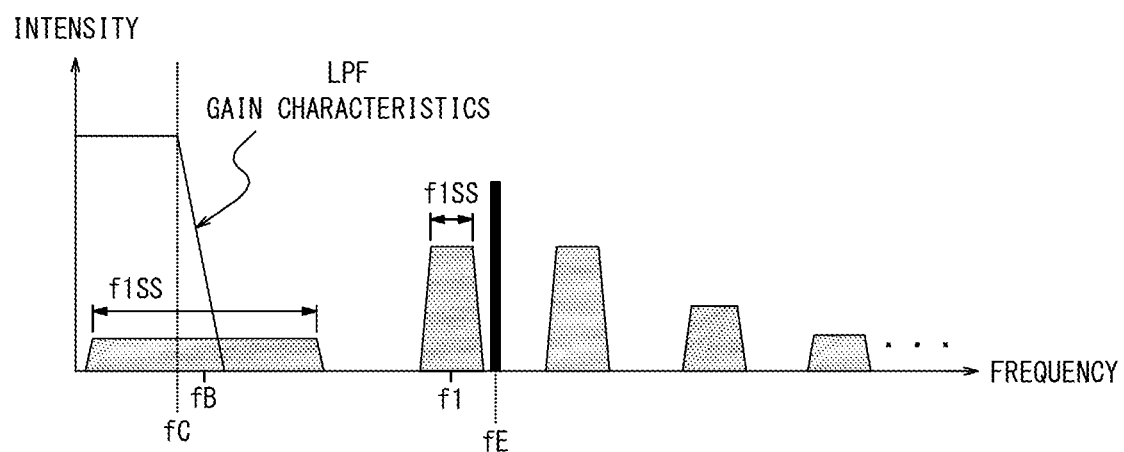
FIG. 10 is a diagram illustrating the frequency spectrum of the detection result in a case in which the frequency of the magnetism to be detected is close to the excitation frequency in the magnetic detection apparatus according to the embodiment.

The signal (S4) detected by the wave detector 13 is represented as a frequency spectrum divided into frequency components as illustrated in FIGS. 9 and 10. In FIGS. 9 and 10, the horizontal axis is a logarithmic axis representing frequency. The vertical axis represents the intensity of each frequency component. The component with a center frequency of f1 and a width of the frequency band of f1SS corresponds to the spread excitation signal (S1_SS) flowing in the exciter 11. The component with a center frequency of f1 is also referred to as the fundamental component. Components with a center frequency higher than f1 are also referred to as harmonic components.

FIG. 9 represents the frequency spectrum of the signal (S4) in a case in which the frequency (fE) of the magnetic flux (φE) generated in the core 10 in response to the magnetic field externally applied to the core 10 is significantly lower than the excitation frequency (f1) and lower than the cutoff frequency (fC) of the LPF 14. Among the frequency components of the signal (S4) represented by the frequency spectrum in FIG. 9, the components with frequencies higher than fC are attenuated by the LPF 14. The signal outputted from the LPF 14 is only the component with frequency fE, which is the signal corresponding to the magnetic flux (φE). Consequently, the signal processor 17 can detect the magnetic flux (φE). By the signal converter 16 controlling the frequency spectrum of each of the excitation signal and detection signal, the signal corresponding to the magnetic flux (φE) included in the signal synchronously detected by the wave detector 13 is less likely to be deformed. Consequently, the magnetic flux (9E) and the magnetic field that generates the magnetic flux (φE) can be detected with high accuracy.

Figure 11:
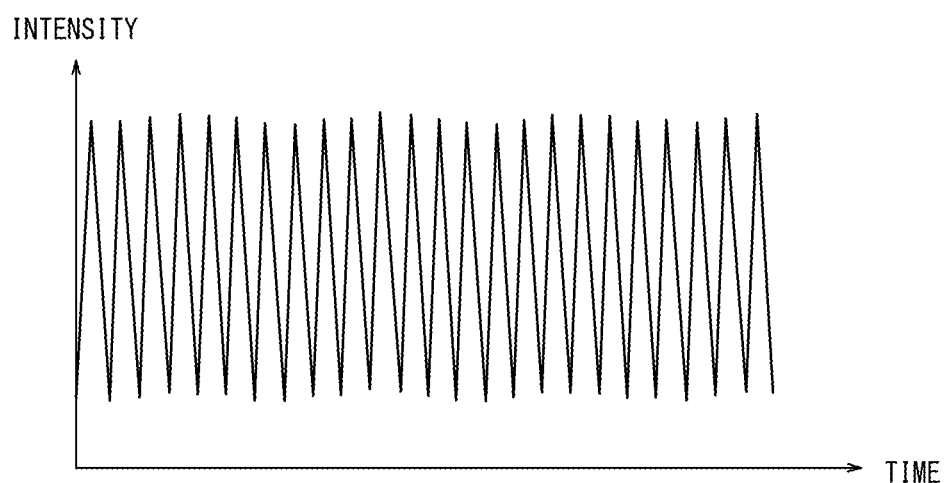
FIG. 11 is a diagram illustrating the waveform of the signal detected in a case in which the frequency of the magnetism to be detected is close to the excitation frequency in the magnetic detection apparatus according to the embodiment.

Conversely, FIG. 10 represents the frequency spectrum of the signal (S4) in a case in which the frequency (fE) of the magnetic flux (φE) generated in the core 10 in response to the magnetic field externally applied to the core 10 is close to the excitation frequency (f1) or to a multiple of f1 and is higher than the cutoff frequency (fC) of the LPF 14. The signal corresponding to the frequency spectrum in FIG. 10 has the waveform illustrated in FIG. 11. In FIG. 11, the vertical axis represents signal intensity, and the horizontal axis represents time. The waveform in FIG. 11 includes a component corresponding to a beat signal that has, as its frequency, the difference between the frequency included in the excitation signal (S1) (the frequency in a range such that the center frequency is f1 and the width of the frequency band is f1SS) and the frequency fE of the magnetic flux φE. The component corresponding to the beat signal is represented in FIG. 10 as a component with a center frequency of fB and a width of the frequency band of f1SS.

Figure 12:
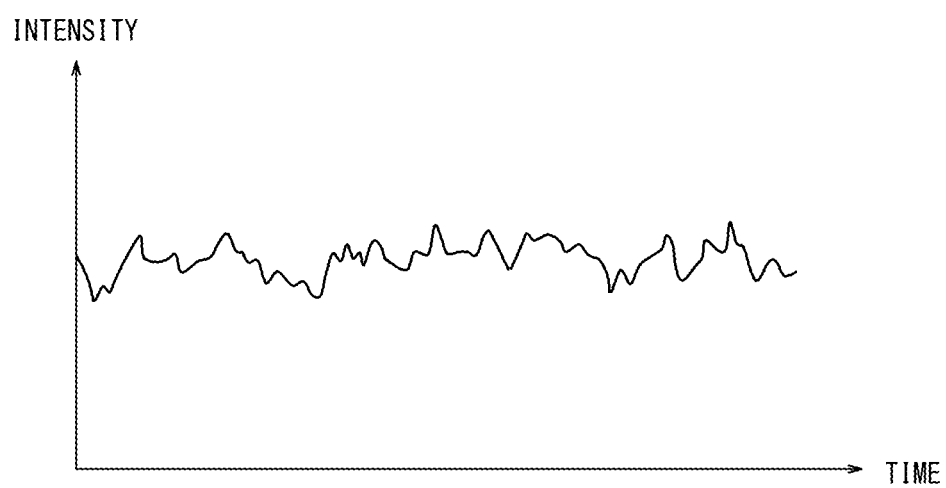
FIG. 12 is a diagram illustrating the waveform of the signal illustrated in FIG. 11 processed by a LPF.

Among the frequency components of the signal (S4) represented by the frequency spectrum in FIG. 10, the components with frequencies higher than fC are attenuated by the LPF 14. Suppose that the frequency of at least some of the components corresponding to the beat signal is higher than fC. In this case, at least some of the components corresponding to the beat signal are attenuated by the LPF 14. Consequently, the beat signal included in the signal outputted from the LPF 14 becomes smaller. The signal outputted from the LPF 14 becomes a signal that does not have a specific frequency component, such as a frequency component of the beat signal, and has the waveform illustrated in FIG. 12. In FIG. 12, the vertical axis represents signal intensity, and the horizontal axis represents time. As a result of the signal outputted from the LPF 14 not having a specific frequency component, the signal processor 17 is less likely to detect the beat signal erroneously as the magnetic flux (φE). In other words, in a case in which the magnetic flux (φE) does not include a low-frequency component below the cutoff frequency of the LPF 14, the signal processor 17 can detect a signal corresponding to the magnetic flux (φE) that does not include a low-frequency component.

As described above, the magnetic detection apparatus 1 according to the present embodiment excites the core 10 with an excitation signal having a spread spectrum. The magnetic detection apparatus 1 performs synchronous detection, from the signal of the induced voltage generated by the excitation of the core 10, based on a detection signal with a spread spectrum. The magnetic detection apparatus 1 passes the synchronously detected signal through the LPF 14 to detect the signal corresponding to the magnetic flux ($\varphi$E) generated in the core 10. Based on the signal corresponding to the magnetic flux ($\varphi$E), the magnetic detection apparatus 1 detects, as magnetism, the magnetic field applied to the magnetic detection apparatus 1. By spreading the spectrum of the excitation signal and the detection signal, the magnetic detection apparatus 1 is less likely to detect a beat signal, even in a case in which the frequencies included in the magnetic field to be detected are close to the frequencies of the excitation signal or to multiples of these frequencies. The magnetic detection apparatus 1 according to the present embodiment can thereby improve the detection accuracy of magnetic fields in the frequency region lower than the cutoff frequency of the LPF 14, regardless of the frequencies included in the magnetic field to be detected. In other words, the magnetic detection apparatus 1 according to the present embodiment can improve the detection accuracy of a direct current magnetic field or low-frequency magnetic field included in the magnetic field to be detected even in a case in which the magnetic field to be detected may include high-frequency components, such as the excitation frequency or detection frequency.

The signal processor 17 may be configured to include a processor such as a central processing unit (CPU). The signal processor 17 may execute various operations, such as excitation or detection, by executing a predetermined program. The signal processor 17 may detect a signal corresponding to the magnetic flux ($\varphi$T) generated in the core 10 according to a magnetic field applied externally to the magnetic detection apparatus 1 by implementing the operations of the signal generator 15, the signal converter 16, the wave detector 13, and the LPF 14 through software processing. The signal processor 17 may calculate the magnetic field to be detected that produces the magnetic flux ($\varphi$T) based on the result of detecting the signal corresponding to the magnetic flux ($\varphi$T).

The magnetic detection apparatus 1 may further include an interface for outputting the result of detecting the magnetic field to be detected to an external apparatus. The interface may include various communication interfaces. The magnetic detection apparatus 1 may further include a display device for displaying the result of detecting the magnetic field to be detected. The display device may be configured to include various displays, such as, for example, a liquid crystal display.

(Current Detection Apparatus 20)

Figure 13:
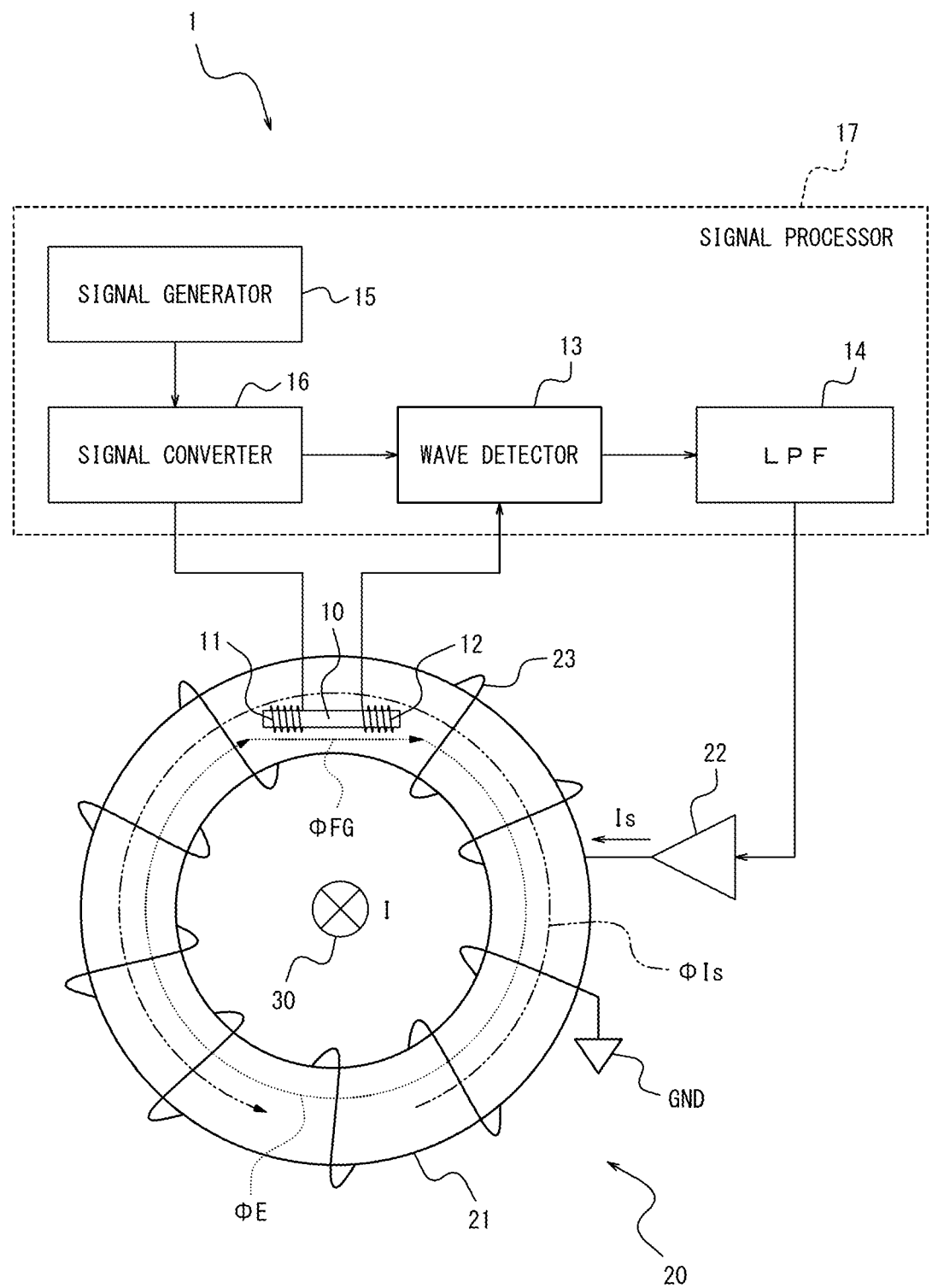
FIG. 13 is a schematic diagram of an example configuration of a current detection apparatus according to an embodiment.

The magnetic detection apparatus 1 may be used in a penetration-type current detection apparatus 20 illustrated in FIG. 13. The current detection apparatus 20 includes the magnetic detection apparatus 1, a core 21, an amplifier 22, and a feedback coil 23. The core 21 is also referred to as a current detecting core. The core 21 is annularly configured so that a wire 30, through which a current I to be detected flows, penetrates through the inside of the core 21. The core 21 is configured to include a magnetic material so that a magnetic flux is generated according to the magnetic field generated by the current I to be detected. The magnetic flux generated in the core 21 is represented as $\varphi$E. When the current I flows toward the depth direction of the paper, magnetic flux ($\varphi$E) is generated in the clockwise direction by the right-hand rule. In other words, the core 21 is positioned to surround the wire 30 through which the current to be detected flows.

The core 21 includes therein the core 10, of the magnetic detection apparatus 1, around which are wound the coils of the exciter 11 and the detector 12. In other words, the core 10 of the magnetic detection apparatus 1 is installed in the core 21. The magnetic flux according to the magnetic field generated by the current I, which is the current to be detected, is also generated in the core 10 of the magnetic detection apparatus 1. The magnitude of the magnetic flux generated in the core 21 and the magnitude of the magnetic flux generated in the core 10 can be proportional. The magnetic detection apparatus 1 excites the core 10 with the exciter 11 to generate a magnetic flux ($\varphi$FG), and the detector 12 detects the induced voltage. The signal processor 17 of the magnetic detection apparatus 1 detects the signal corresponding to the magnetic flux generated in the core 10 of the magnetic detection apparatus 1, i.e., the magnetic flux ($\varphi$T) generated in the core 21 of the current detection apparatus 20.

The signal processor 17 outputs the signal corresponding to the magnetic flux ($\varphi$T) generated in the core 21 of the current detection apparatus to the amplifier 22. The amplifier 22 generates a current signal according to the signal corresponding to the magnetic flux ($\varphi$T) and applies current to the feedback coil 23. The feedback coil 23 is connected between the output of the amplifier 22 and a ground point represented as GND. The current inputted from the amplifier 22 flows toward the ground point. A magnetic flux is generated in the core 21 by the current flowing in the feedback coil 23. The magnetic flux generated in the core 21 by the current flowing in the feedback coil 23 is represented as $\varphi$Is.

The current detection apparatus 20 operates so that the magnetic flux ($\varphi$T) is canceled by the magnetic flux ($\varphi$Is). Specifically, the direction of the current flowing in the feedback coil 23 or the direction in which the feedback coil 23 is wound around the core 21 is set so that the magnetic flux ($\varphi$Is) is generated in the opposite direction from the magnetic flux ($\varphi$T). In FIG. 13, the magnetic flux ($\varphi$Is) is generated in the counterclockwise direction. The magnitude of the current flowing in the feedback coil 23 is set so that the magnitude of the magnetic flux ($\varphi$Is) matches the magnetic flux (PT).

When the magnetic flux ($\varphi$Is) cancels the magnetic flux ($\varphi$T), the magnetic field measured by the magnetic detection apparatus 1 becomes 0. The magnitude of the current Is that is passed by the amplifier 22 to the feedback coil 23 when the magnetic field measured by the magnetic detection apparatus 1 becomes 0 corresponds to the magnitude of the current I that is generating the magnetic flux ($\varphi$T). The current detection apparatus 20 can calculate the magnitude of the current I based on the magnitude of the current Is.

As an embodiment of the current detection apparatus 20, a simulation of the operations of the current detection apparatus 20 and the magnetic detection apparatus 1 was performed under the following conditions.

excitation frequency (f1): 99 kHz
upper and lower limits on the frequency band of the excitation signal that has a spread spectrum: 99 kHz±10%
Cutoff frequency (fC) of LPF 14: 150 Hz
Frequency of current I: 198.1 kHz
Intensity of current I: equivalent to 0.2 Arms
Frequency of beat signal: 100 Hz (equal to 198.1−99×2 kHz)

Under the conditions described above, the frequency of the current I is higher than the cutoff frequency of the LPF 14. Therefore, a signal corresponding to the current I is not contained in the output of the LPF 14. Also, the frequency of the beat signal is lower than the cutoff frequency of the LPF 14. Therefore, the beat signal can be included in the output of the LPF 14 as noise. The current (Is) that the amplifier 22 passes based on the output of the LPF 14 is noise current.

In a case in which the spectrum of the excitation signal was not spread, the output current (Is) of the amplifier 22 when the magnetic flux (φIs) canceled the magnetic flux (φT) was 0.221 Arms. On the other hand, in a case in which the spectrum of the excitation signal was spread, the output current (Is) of the amplifier 22 when the magnetic flux (φIs) canceled the magnetic flux (φT) was 0.0268 Arms. The output current (Is), which is noise current, was reduced by spreading the spectrum of the excitation signal. The reduction ratio is −18.3 dB. From the above, it is clear that the beat signal is reduced by spreading the spectrum of the excitation signal.

The magnetic detection apparatus 1 is not limited to the penetration-type current detection apparatus 20 illustrated in FIG. 13 and may be used in a clamp-type current detection apparatus 20.

In the current detection apparatus 20, the detection accuracy of the magnetic field by the magnetic detection apparatus 1 affects the accuracy of detecting whether the magnetic flux (φIs) cancels the magnetic flux (φT). The enhanced detection accuracy of the magnetic field by the magnetic detection apparatus 1 enhances the detection accuracy of the current by the current detection apparatus 20.

Although embodiments of the present disclosure have been described through drawings and examples, it is to be noted that various changes and modifications may be made by those skilled in the art on the basis of the present disclosure. Therefore, such changes and modifications are to be understood as included within the scope of the present disclosure. For example, the functions and the like included in the various components may be reordered in any logically consistent way. Furthermore, components may be combined into one or divided.

The invention claimed is:

1. A magnetic detection apparatus comprising:
a core to which magnetism to be detected is applied;
an exciter configured to excite the core with an excitation signal;
a detector configured to detect induced voltage according to a time change of magnetic flux generated by the core;
a wave detector configured to detect a wave from a signal corresponding to the induced voltage by using a detection signal corresponding to the excitation signal and to generate a signal according to the magnetism to be detected; and
a signal converter configured to generate and output to the exciter a signal that has a spread spectrum of a signal having an excitation frequency as the excitation signal and to generate and output to the wave detector a detection signal that has a spread spectrum of a signal having a detection frequency of twice the excitation frequency, wherein an upper and lower limits of a frequency band of the excitation signal are values yielded by increasing and decreasing the excitation frequency by a predetermined percentage.

2. The magnetic detection apparatus according to claim 1, wherein the signal converter is configured to generate the excitation signal and the detection signal so that a width of a frequency band of the detection signal is twice a width of a frequency band of the excitation signal.

3. The magnetic detection apparatus according to claim 1, further comprising:
a low pass filter configured to attenuate a frequency component, equal to or greater than a cutoff frequency, of the signal according to the magnetism to be detected generated by the wave detector, wherein
the signal converter is configured to generate the excitation signal so that a value of a width of a frequency band of the excitation signal is greater than twice a value of the cutoff frequency.

4. The magnetic detection apparatus according to claim 2, further comprising:
a low pass filter configured to attenuate a frequency component, equal to or greater than a cutoff frequency, of the signal according to the magnetism to be detected generated by the wave detector, wherein
the signal converter is configured to generate the excitation signal so that a value of a width of a frequency band of the excitation signal is greater than twice a value of the cutoff frequency.

5. The magnetic detection apparatus according to claim 1, wherein the spread spectrum is a continuous spectrum.

6. A current detection apparatus comprising:
a magnetic detection apparatus, wherein the magnetic detection apparatus comprises:
a core to which magnetism to be detected is applied,
an exciter configured to excite the core with an excitation signal,
a detector configured to detect induced voltage according to a time change of magnetic flux generated by the core,
a wave detector configured to detect a wave from a signal corresponding to the induced voltage by using a detection signal corresponding to the excitation signal and to generate a signal according to the magnetism to be detected,
a signal converter configured to generate and output to the exciter an excitation signal that has a spread spectrum of a signal having an excitation frequency and to generate and output to the wave detector a detection signal that has a spread spectrum of a signal having a detection frequency of twice the excitation frequency, and
a low pass filter configured to attenuate a frequency component, equal to or greater than a cutoff frequency, of the signal according to the magnetism to be detected generated by the wave detector, wherein the signal converter is configured to generate the excitation signal so that a value of a width of a frequency band of the excitation signal is greater than twice a value of the cutoff frequency;
a current detection core in which the core of the magnetic detection apparatus is installed;
a feedback coil wound around the current detection core; and
an amplifier configured to apply a current to the feedback coil according to a signal outputted from the low pass filter of the magnetic detection apparatus, wherein
the current detection core is positioned to surround a wire through which a current to be detected flows.

* * * * *